United States Patent [19]
Kanda et al.

[11] Patent Number: 5,793,471
[45] Date of Patent: Aug. 11, 1998

[54] PROJECTION EXPOSURE METHOD AND APPARATUS IN WHICH SCANNING EXPOSURE IS PERFORMED IN ACCORDANCE WITH A SHOT LAYOUT OF MASK PATTERNS

[75] Inventors: Tsuneo Kanda; Yuichi Yamada, both of Utsunomiya; Shigeyuki Uzawa, Tokyo, all of Japan

[73] Assignee: Canon Kabushiki Kaisha, Tokyo, Japan

[21] Appl. No.: 674,790

[22] Filed: Jul. 3, 1996

[30] Foreign Application Priority Data

Jul. 7, 1995 [JP] Japan .................................. 7-172067

[51] Int. Cl.$^6$ .............................. G03B 27/42; G01B 11/00
[52] U.S. Cl. ................................................ 355/53; 356/399
[58] Field of Search .................... 355/53, 54, 67, 355/71; 356/399, 400, 401; 250/548

[56] References Cited

U.S. PATENT DOCUMENTS

| | | | |
|---|---|---|---|
| 4,488,806 | 12/1984 | Takahashi et al. | 355/54 |
| 4,489,241 | 12/1984 | Matsuda et al. | 250/491.1 |
| 4,530,587 | 7/1985 | Kosugi et al. | 355/53 |
| 4,792,693 | 12/1988 | Yamaguchi et al. | 356/401 |
| 4,924,257 | 5/1990 | Jain | 355/53 |
| 5,112,133 | 5/1992 | Kurosawa et al. | 356/401 |
| 5,155,523 | 10/1992 | Hara et al. | 355/53 |
| 5,182,615 | 1/1993 | Kurosawa et al. | 356/400 |
| 5,305,222 | 4/1994 | Nakamura | 355/53 |
| 5,331,371 | 7/1994 | Mori et al. | 355/53 |
| 5,337,247 | 8/1994 | Hamaguchi | 250/491.1 |
| 5,386,269 | 1/1995 | Kosugi | 355/53 |
| 5,448,333 | 9/1995 | Iwamoto et al. | 355/53 |
| 5,473,410 | 12/1995 | Nishi | 355/53 |
| 5,483,056 | 1/1996 | Imai | 250/548 |
| 5,499,099 | 3/1996 | Sato et al. | 356/400 |
| 5,534,970 | 7/1996 | Nakashima et al. | 355/53 |
| 5,543,921 | 8/1996 | Uzawa et al. | 356/401 |
| 5,617,182 | 4/1997 | Wakamoto et al. | 355/53 |

FOREIGN PATENT DOCUMENTS

| | | |
|---|---|---|
| 0491375 | 6/1992 | European Pat. Off. . |
| 0633506 | 1/1995 | European Pat. Off. . |

*Primary Examiner*—R. L. Moses
*Assistant Examiner*—Shival Virmani
*Attorney, Agent, or Firm*—Fitzpatrick, Cella, Harper & Scinto

[57] ABSTRACT

An exposure method and apparatus usable with a mask stage for holding a mask having an original pattern, a projection optical system for projecting at least a portion of the original pattern at a predetermined magnification and a substrate stage for holding a photosensitive substrate on an imaging plane of the projection optical system. The mask stage and the substrate stage are moved in a timed relation along a scan direction at a speed ratio corresponding to the magnification of the projection optical system by which a projected image of the original pattern can be scanningly printed on shots of the photosensitive layout. Scanning exposure is controlled on the basis of a shot layout of the photosensitive substrate which is determined per chip from information related to a chip structure and a chip size of the original pattern. The original pattern includes a plurality of original chip patterns. Each shot area of the photosensitive substrate has a plurality of printed chip patterns having been formed thereon through an exposure process with a different exposure method or apparatus, separate from the scanning exposure method or apparatus, and the shot layout is determined so that the number of shots with the scanning method or apparatus is fewer.

7 Claims, 7 Drawing Sheets

PROJECTION EXPOSURE METHOD AND APPARATUS IN WHICH SCANNING EXPOSURE IS PERFORMED IN ACCORDANCE WITH A SHOT LAYOUT OF MASK PATTERNS

FIELD OF THE INVENTION AND RELATED ART

This invention relates to a scanning exposure apparatus and a device manufacturing method using the same. More particularly, the invention is concerned with a scanning exposure apparatus for use in the manufacture of devices such as semiconductor devices or liquid crystal panels, for example, for scanningly projecting a pattern of a mask onto a photosensitive substrate by exposure and, in another aspect, it is concerned with a device manufacturing method using such an exposure apparatus.

Photolithographic processes for the manufacture of devices such as semiconductor devices (chips) or liquid crystal panels, for example, using a fine pattern, are performed generally by using a sequential motion type exposure apparatus (called a "stepper") for transferring, by exposure, a pattern of a mask (called a "reticle) onto a photosensitive layer (e.g., a photoresist) applied to a semiconductor substrate (e.g., a wafer) or a glass substrate.

In order to meet recent needs of increased density of device such as a DRAM, for example, or higher yield of devices, being required by semiconductor devices manufacturers, stepper manufacturers have made efforts to develop projection optical systems enabling further miniaturization of printed patterns and further enlargement of the picture field size. However, miniaturization of printed patterns and the enlargement of the picture field size involve increased difficulties of design or production of projection optical systems.

One solution for pattern miniaturization may be shortening the wavelength of the exposure light source. In place of the bright line of i-line (wavelength λ=365 nm) of ultra-high pressure Hg lamps having been used prevalently, excimer lasers (wavelength λ=248 mn) will be used for 256M DRAM chips.

Another solution for the above-described problem may be a scanning exposure apparatus wherein a mask and a wafer are scanned and exposed while they are scanningly moved in opposite directions at a speed ratio corresponding to the magnification of a projection optical system.

As compared with an exposure region of a size 22×22 (mm) defined by a stepper, for example, a scanning exposure apparatus may define an exposure region of a size 26×33 (mm). For earlier 256M DRAM chips of a size 14×25 (mm), one chip can be produced by one shot. For shrink version 256M DRAM chips of a size 11×20 (mm), eight chips can be produced by one shot. Also, there is a multi-chip process wherein four 64M DRAM chips are coupled to provide a 256M DRAM chip. Such a process of preparing plural chips in one shot will be used prevalently in the manufacture of semiconductor devices.

SUMMARY OF THE INVENTION

Figure 11:
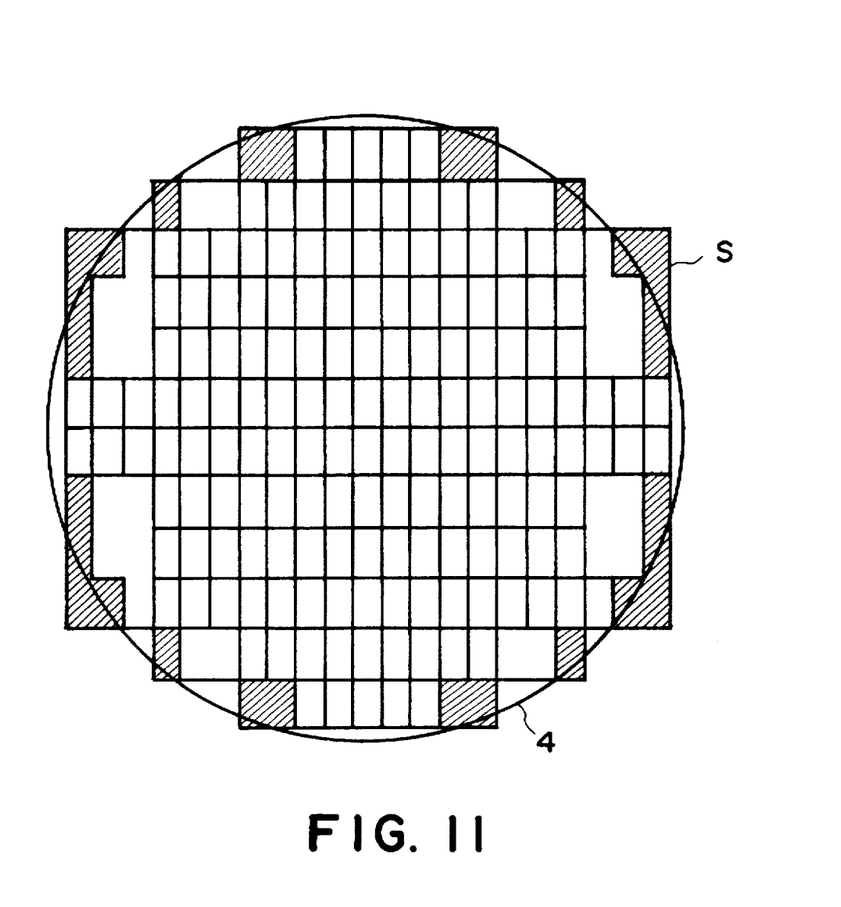
FIG. 11 is a schematic view for explaining a shot layout on a wafer, including those portions from which no chip could be produced.

For utilization of a wafer without loss, it is effective to perform pattern printing over the whole wafer surface. For shrink version 256M DRAM chips, for example, it results in an increase in the production of a few chips, as compared with a case where the whole surface is not exposed. If the pattern printing is to be performed to the whole surface of a wafer in the manner as shown in FIG. 11, hatched portions S of a wafer 4 are overlaid on the edge of the wafer 4. Thus, the resultants provided by performing the pattern printing operation to such regions would not be used as devices.

Nevertheless, if the pattern printing is performed to the whole surface of a wafer by using a scanning exposure apparatus such as described above, the scanning time is wasted. This causes a decrease of throughput. There is an additional problem that additional exposure of such a wafer region not contributable to semiconductor chip production will wastefully reduce the lifetime of a light source. Particularly when an expensive light source such as an excimer laser is used as an exposure light source, reduction of pulse lifetime is very undesirable.

Further, when the exposure process is to be performed per one shot, the focus measurement has to be done also per one shot. This makes the process complicated, in relation to the wafer peripheral portions.

It is accordingly an object of the present invention to provide a scanning exposure apparatus or a device manufacturing method by which patterns can be printed on a photosensitive substrate with higher throughput and without loss.

In accordance with an aspect of the present invention, there is provided an exposure apparatus, comprising: a mask stage for holding a mask having an original pattern and being reciprocally movable along a scan direction; a projection optical system for projecting at least a portion of the original pattern at a predetermined magnification; a substrate stage for holding a photosensitive substrate on an imaging plane of said projection optical system and being reciprocally movable along the scan direction; wherein said mask stage and said substrate stage are able to be moved simultaneously or in a timed relation and at a speed ratio corresponding to the magnification of said projection optical system by which a projected image of the original pattern is scanningly printed on shots of the photosensitive substrate; and control means for controlling the scanning exposure on the basis of a shot layout of the photosensitive substrate which is determined per chip from information related to a chip structure and a chip size of the original pattern.

The shot layout may be recorded prior to the scanning exposure and wherein said control means controls the scanning exposure in accordance with the record. Said apparatus may further comprise a light blocking plate disposed at one of a position adjacent to the mask and a position optically conjugate with the mask and being reciprocally movable along the scan direction, wherein, when the original pattern is scanningly printed on the photosensitive substrate, said light blocking plate may be moved in a timed relation with a boundary of an exposure region of the mask and at a speed ratio to the mask corresponding to the magnification.

In accordance with another aspect of the present invention, there is provided a scanning exposure method usable with a mask stage for holding a mask having an original pattern and being reciprocally movable along a scan direction, a projection optical system for projecting at least a portion of the original pattern at a predetermined magnification, and a substrate stage for holding a photosensitive substrate on an imaging plane of the projection optical system and being reciprocally movable along the scan direction, said method comprising the steps of: moving the mask stage and the substrate stage in a timed relation and at a speed ratio corresponding to the magnification of the projection optical system by which a projected image of the original pattern can be scanningly printed on shots of the photosensitive substrate; determining a shot layout of the photosensitive substrate per chip from information related to a chip structure and a chip size of the original pattern; and controlling the scanning exposure in accordance with the shot layout.

The shot layout may be recorded prior to the scanning exposure and wherein the scanning exposure is controlled in accordance with the record.

In accordance with a further aspect of the present invention, there is provided a device manufacturing method usable with a mask stage for holding a mask having an original pattern and being reciprocally movable along a scan direction, a projection optical system for projecting at least a portion of the original pattern at a predetermined magnification, and a substrate stage for holding a photosensitive substrate on an imaging plane of the projection optical system and being reciprocally movable along the scan direction, said method comprising the steps of: moving the mask stage and the substrate stage in a timed relation and at a speed ratio corresponding to the magnification of the projection optical system by which a projected image of the original pattern can be scanningly printed on shots of the photosensitive substrate, for manufacture of devices; determining a shot layout of the photosensitive substrate per chip from information related to a chip structure and a chip size of the original pattern; and controlling the scanning exposure in accordance with the shot layout.

The shot layout may be recorded prior to the scanning exposure and wherein the scanning exposure is controlled in accordance with the record.

Briefly, in accordance with the present invention, in the scanning exposure process for wafer peripheral portions, the exposure process is not performed per one single shot but it is performed per a chip or chips which are effective. In the multi-chip procedure described hereinbefore, for a 256M DRAM, for example, those for a 64M DRAM may be considered as one chip and the exposure process may be performed to them.

To this end, the layout may be designed so as to get a largest number of chips, while taking into account the chip structure or chip size. During the scanning exposure, for a case where only one chip of three chips of one shot is to be exposed, for example, the scan for exposure may be performed for the one chip and the scan for the others may not be performed any more. This enables elimination of a scan of unnecessary regions, and it enables enhancement of throughput. Also, it avoids unnecessary exposure and enables enhancement of the lifetime of the light source.

As regards the focus measurement to wafer peripheral portions, since there is no exposure region lying outside the wafer surface, it is assured that the measurement is surely performed upon the wafer surface. There is no necessity of a peculiar procedure to wafer peripheral portions, and this reduces the possibility of measurement error.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
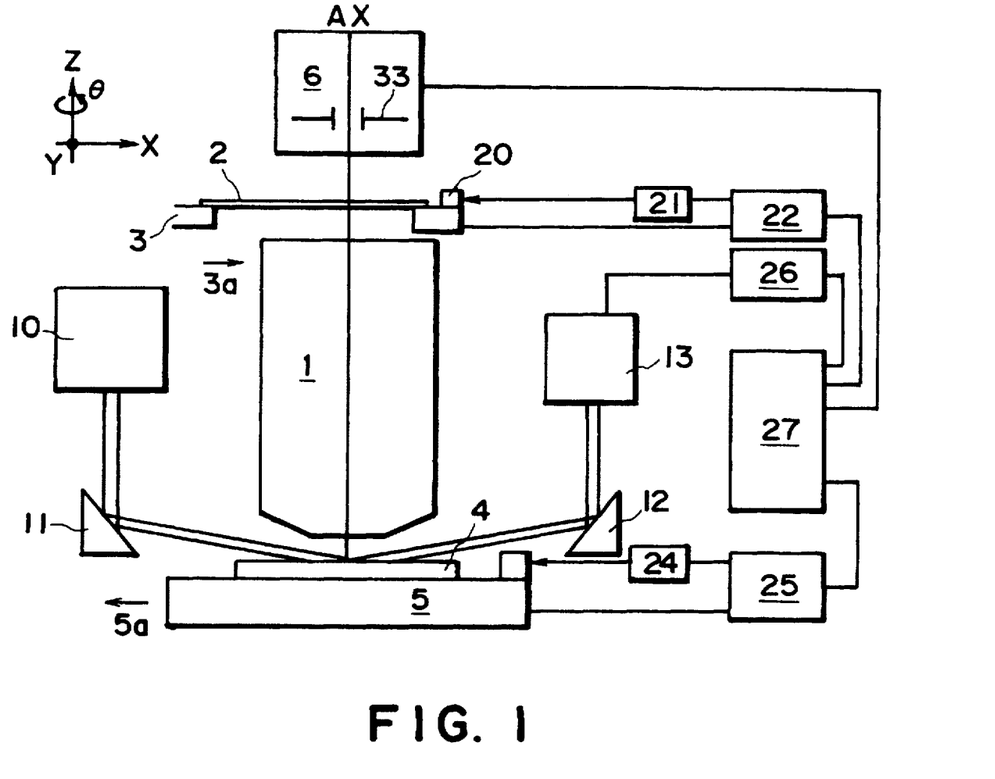
FIG. 1 is a schematic and diagrammatic view of a scanning exposure apparatus according to an embodiment of the present invention.

FIG. 1 shows a projection exposure apparatus according to an embodiment of the present invention. In this embodiment, the invention is applied to a projection exposure apparatus of what can be called a "step-and-scan type", wherein wafer movement and wafer exposure are repeated in a step-and-repeat process while, on the other hand, the exposure of every shot of the wafer is performed by scanning exposure.

Denoted in FIG. 1 at 1 is a reduction projection lens (projection optical system) having an optical axis AX extending parallel to a Z axis of an X-Y-Z coordinate system as illustrated. The projection lens 1 has an image plane which is perpendicular to the Z-axis direction. A reticle (mask) 2 is held on a reticle stage 3. A pattern of the reticle 3 is projected in a reduced scale of 1:4 to 1:2 corresponding to the magnification of the projection lens 1, the projected image being formed upon the image plane of the reduction projection lens 1.

Denoted at 4 is a semiconductor wafer having a photoresist applied to its surface, to provide a photosensitive substrate. There are a number of exposed regions (shot regions) disposed in an array, having been defined through a preceding exposure process or processes. Denoted at 5 is a stage on which the wafer 4 is placed. It comprises a chuck for attracting and fixing the wafer 4 to the wafer stage 5, an X-Y stage movable horizontally in X and Y directions, respectively, a leveling stage movable in the Z-axis direction corresponding to the optical axis direction of the projection lens 1 and being rotationally movable about the X and Y axes, and a rotatable stage being rotationally movable about the Z axis. Thus, it provides a six-axis correction system adapted to register shot regions of the wafer 4 with a projected image of the reticle 2 pattern formed by the projection lens 1.

Denoted in FIG. 1 at 10, 11, 12 and 13 are components of a focus and tilt detection optical system which serves to detect the position of the surface of the wafer 4 with respect to the optical axis AX and any tilt of that surface with respect to the X-Y plane. Denoted specifically at 10 is a light projecting system by which a plurality of (six, for example)

parallel light beams are produced. These light beams are directed by way of a mirror 11 to six measurement points upon the wafer 4 surface. While only two light beams are illustrated in FIG. 1, each beam represents three light beams located in the direction of the depth (perpendicular direction) of the sheet of the drawing.

Figure 2:
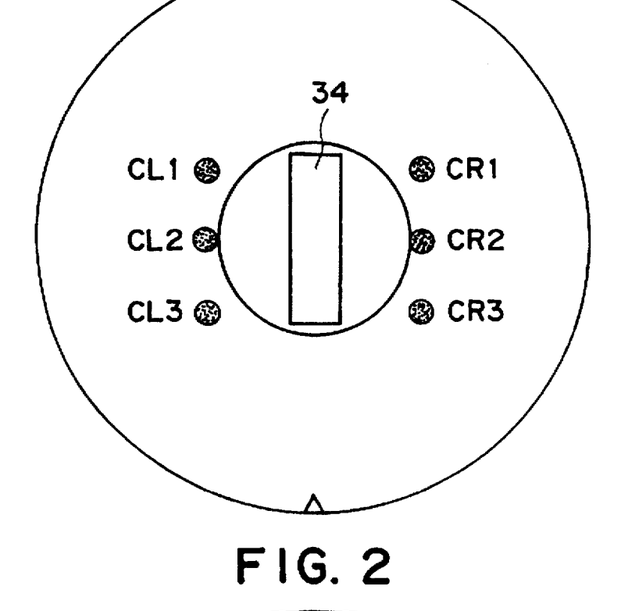
FIG. 2 is a schematic view for explaining an exposure region of a wafer and focus measurement points.
Figure 3:
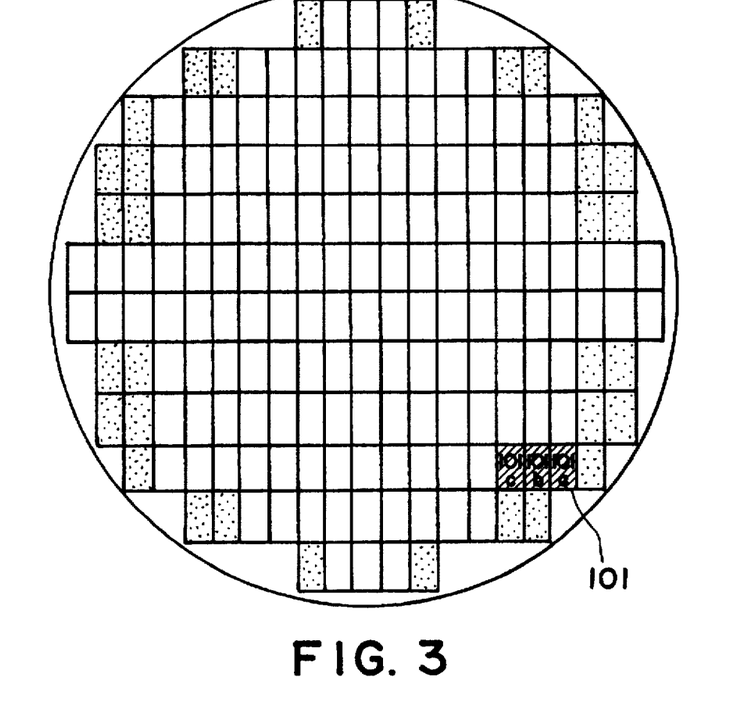
FIG. 3 is a schematic view for explaining a shot layout on the surface of a wafer.

Upon the wafer 4 surface, as shown in FIG. 3, there are plural shot regions (regions onto which the pattern of the reticle 2 is to be transferred) disposed in an array. The six light beams projected by the light projecting system 10 are incident, as best seen in FIG. 2, on six separate measurement points CL1, CL2, CL3, CR1, CR2 and CR3 of a shot region.

Reflected light beams from the wafer 4 are received by a light receiving system 13, by way of a mirror 12. The light receiving system 13 is arranged to perform tilt correction so that the measurement points CL1–CL3 and CR1–CR3 on the wafer 4 surface are placed in an optically conjugate relation with the detection surface of the light receiving system 13. Thus, the position of a pinhole image upon the detection surface of the light receiving system 13 does not change with any local inclination of the measurement points CL1–CL3 and CR1–CR3. Rather, in response to any change in level (height) of the measurement points with respect to the optical axis AX direction, the pinhole image displaces on the detection surface of the light receiving system 13.

Now, the scanning exposure operation in this embodiment will be explained. As shown in FIG. 1, after the reticle 2 is attracted to and held fixed to the stage 3, it is scanningly moved in the X-axis direction in FIG. 1, along the X-Y plane perpendicular to the optical axis AX of the projection lens 1, at a constant speed. Simultaneously, as regards the Y-axis direction (perpendicular to the sheet of the drawing), it is correctively moved so as to constantly assure that a target coordinate position is scanned. Positional information related to the reticle stage 2, with respect to the X-axis and Y-axis directions, is measured continuously by means of a laser interferometer system 21 wherein plural laser beams are projected from reticle side laser interferometers 21 (for measurements in the X and Y axes) to half mirrors 20 (for measurements in the X and Y axes) which are fixedly mounted on the reticle stage 3.

Exposure illumination system 6 comprises a light source (not shown), such as an excimer laser, for example, adapted to produce light pulses, and it includes components such as a beam shaping optical system, an optical integrator, a collimator and a mirror, for example, all being unshown in the drawing. These components are made of a material or materials efficiently passing or reflecting the pulse light which is in the deep ultraviolet region. The beam shaping optical system serves to transform the sectional shape (including size) of a received light beam into a desired shape, and the optical integrator serves to make uniform the distribution characteristic of the light so that the reticle 2 is illuminated with uniform illuminance.

Exposure illumination optical system 6 further includes a masking blade 33 which is disposed at a position optically conjugate with the surface of the reticle 2. It serves to define an illumination region 34 of a rectangular shape, corresponding to the chip size of the wafer 4. As shown in FIG. 2, a portion of the pattern of the reticle 2 as partially illuminated with the illumination region 34, is projected by the projection lens 1 onto the wafer 4 surface, which is coated with the resist.

Main control unit 27 shown in FIG. 1 serves to control the whole system of the apparatus, so as to perform the scanning exposure while adjusting and placing a slit image of the reticle 2 within a particular region on the wafer 4, at a particular position on the X-Y plane (with respect to the positions in the X-axis and Y-axis directions as well as the position with respect to the rotational direction about an axis parallel to the Z axis) and at a position in the Z-axis direction (with respect to the position in the rotational directions $\alpha$ and $\beta$ about axes parallel to the X and Y axes, respectively, as well as the position of level (height) along the Z-axis direction). More specifically, as regards the alignment of the reticle pattern along the X-Y plane, control data is calculated out of the position data from the reticle side laser interferometer system 21 and from a wafer stage side laser interferometer system 24, as well as out of the position data for the wafer 4 which is obtainable from an alignment microscope system (not shown). Based on the calculated control data, the reticle position control system and the wafer position control system 25 are controlled.

When the reticle stage 3 is scanned in the direction of an arrow 3a shown in FIG. 1, the wafer stage 5 is scanningly moved in the direction of an arrow 5a shown in FIG. 1 at a speed corrected in accordance with the reduction magnification of the projection lens 1. The scanning speed of the reticle stage 3 is determined, while taking into account the width, in the scan direction, of the masking blade 33 within the exposure illumination optical system 6 and the sensitivity of the resist applied to the wafer 4 surface, so that higher throughput is assured.

Alignment of the reticle pattern and the wafer 4 surface with respect to the Z-axis direction, namely, alignment with reference to the image plane, is performed by controlling the leveling stage of the wafer stage 5 through the wafer position controlling system 25, in accordance with the result of calculation by a surface position detecting system 26 which serves to detect the level of the wafer 4 on the basis of the output of the light receiving system 13. More specifically, from the level data of three wafer level measurement light spots which are located in the vicinity of the exposure region 34 (see FIG. 2), with respect to the scan direction, any tilt in the direction perpendicular to the scan direction as well as the level in the optical axis AX direction are calculated. Then, the amount of correction for optimum image plane position, at the exposure position, is detected, and the correction is performed.

Next, the shot layout determination procedure in the present invention will be explained. The layout input is performed by using an input terminal (not shown) connected to the main control unit 27. From this input terminal, the shape or size of a wafer 4, shot size, chip size, chip location within the shot as well as its coordinates, for example, are inputted at first, and they are memorized into storing means, not shown. After being inputted, the information is read out of the storing means by a computer and, from that information, the layout of a largest number of chips that can be provided by the wafer, to be used, is determined.

If one shot comprises plural chips, a shot layout that assures a shortest exposure time for the wafer is determined on the basis of combinations of the determined chip layout. After the layout determination, corresponding layout information is transmitted to the main control unit 27 through a communication line, so that the scanning exposure is performed in the exposure process in accordance with the determined layout.

The procedure of an exposure operation will be explained below. First, description will be made of an example where a blank shot 101 in FIG. 3 is going to be exposed. It is assumed that, in the case of the shot 101, the exposure process is going to be performed in an order from chip 101a to chip 101c.

The reticle stage 3 and the wafer stage 5 are moved so as to place and set the reticle 2 and the wafer 4 at the exposure start point. Until that moment, the shutter for exposure light has not yet been opened. Then, the exposure light shutter is opened, and the exposure process starts. During the exposure process, the reticle 2 and the wafer 4 are scanningly moved while correcting the focus of the wafer 4, tilt of the image plane and the position of the reticle 2 and the wafer 4. After a scan of one shot is completed, the shutter is closed and the wafer stage 5 is moved to the position for the subsequent shot.

Figure 5:
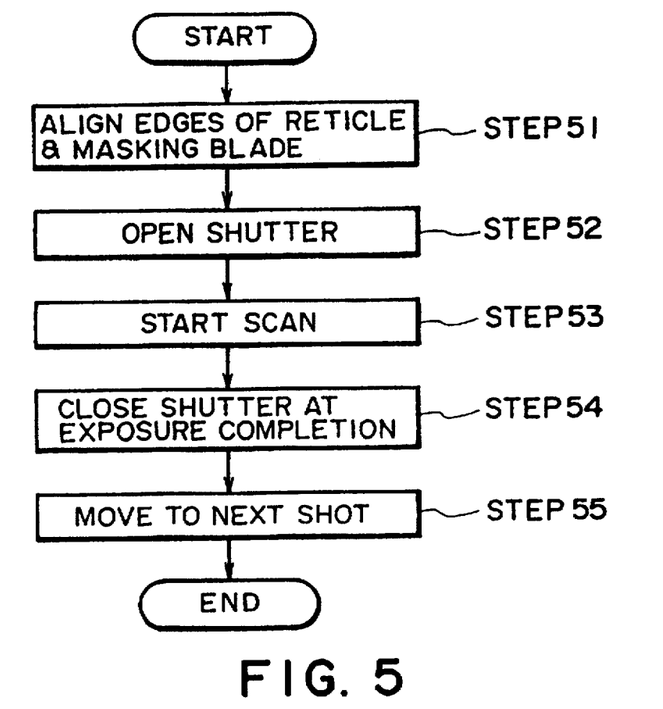
FIG. 5 is a flow chart for explaining the exposure operation in the first embodiment of FIG. 1.
Figure 6A:
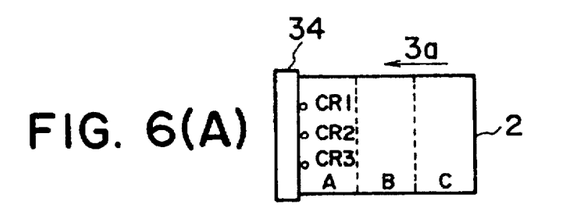
FIGS. 6(A) through 6(C) are schematic views for explaining the exposure operation in the first embodiment of FIG. 1.
Figure 6B:
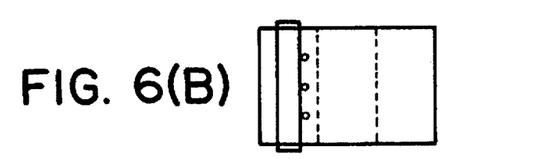
Figure 6C:
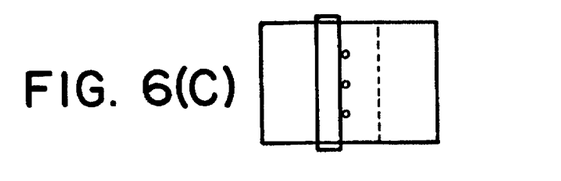

Subsequently, as depicted by hatching in FIG. 3, description will be made on the procedure of exposure operation for a shot wherein only one chip (the size corresponding to the chip 101a in FIG. 3) or two chips (the size corresponding to the combined size of the chips 101a and 101b) can be taken. Particularly, in this example, the scan exposure is performed in a direction from the central side of the wafer toward the outside thereof. Also, in this example, the scan in the exposure process is performed only with respect to the chip or chips to be exposed. FIG. 5 illustrates the exposure sequence in this example, and FIG. 6(A) through 6(C) illustrate; the relationship between the reticle 2 and the opening 34 of the masking blade 33. Since the wafer 4 is moved relative to the masking blade 33 in a similar manner as the reticle 2, it is not shown in FIG. 6(A) through 6(C).

The example of FIG. 6 is a case wherein one shot comprises three chips and, of these chips A, B and C, a description will be made of the exposure of the chip A only.

First, as illustrated in FIG. 6(A), the edge of the exposure region 34 is placed upon the edge of the chip A of the reticle 2 (step 51). Since, in this case, the scan direction is from the central side of the wafer 4 toward the outside thereof, the edge of the chip A is registered with the edge of the pattern of the reticle 2. Also, it is assumed that the required precision for setting the edges of them can well be satisfied by the driving precision of them. If sufficient setting precision is not attainable by the mechanical precision because of the relation of the reticle pattern layout, for example, a separate mechanism for aligning them may be provided.

After the edges are aligned with each other, the exposure light shutter is opened, and the exposure process starts (step 52). Simultaneously with the shutter start, the scan of the reticle 2 starts. At that time, on the wafer 4 side, the focus measurement is performed with respect to the focus measurement points CR1, CR2 and CR3 which are on the side of the exposure region 34 that is going to be exposed. Then, as the points on the wafer 4, whose Z-axis positions have been measured in relation to the measurement points CR1, CR2 and CR3, enter the exposure region 34, correction is made in accordance with the results of the measurement, so as to bring the wafer surface into coincidence with the best focus plane of the projection lens 1.

Additionally, the scan operation is performed while correcting tilt of the image plane or relative positional deviation between the reticle and the wafer, for example, through an alignment mechanism (not shown) (step 58). FIG. 6(B) illustrates the state during the scan operation. In this manner, the scan operation is continued at a constant speed until all the regions of the chip A passes throughout the exposure region 34. As all regions of the chip A pass the exposure region 34, as shown in FIG. 6(C), the exposure light shutter is closed and the exposure process is discontinued (step 54). Then, the stage is moved to a position for a start of exposure of the subsequent shot (step 55). On that occasion, a portion other than the layout is exposed. Since, however, such a portion corresponds to the hatched region S in FIG. 11 where it is inherently eclipsed by the edge of the wafer, there occurs no problem.

As described above, in peripheral shots, a scanning exposure operation for unnecessary regions can be omitted. Thus, the throughput can be increased and the lifetime of the exposure light source can be prolonged.

A second embodiment of the present invention will be described. Also, this embodiment has a feature in the point of exposure of wafer peripheral shots. In this embodiment, the scan direction for exposure of the wafer peripheral portion is from the outside of a wafer toward the inside thereof. Also, in the example to be described below, the scan for exposure is performed only with respect to the chip or chips to be exposed.

Figure 7:
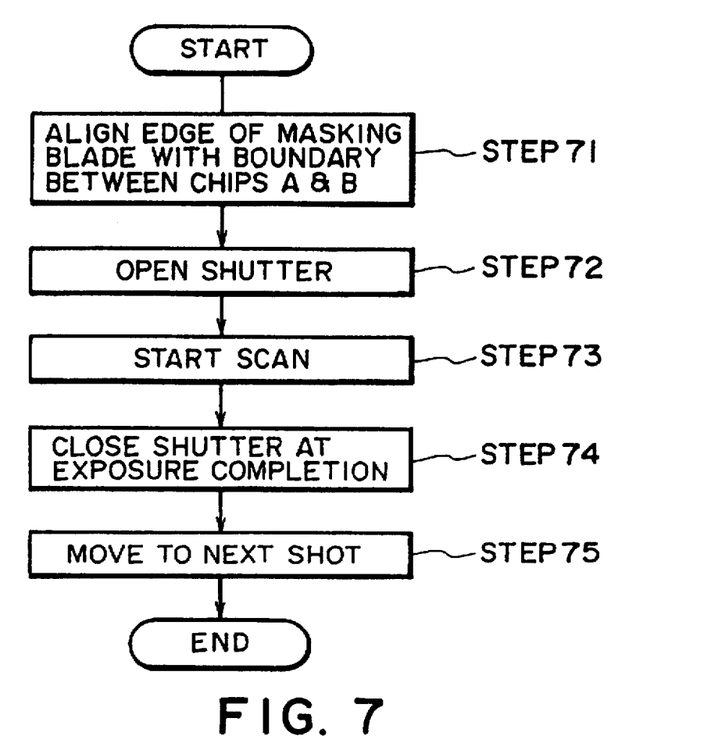
FIG. 7 is a flow chart for explaining the exposure operation in another embodiment of the present invention.
Figure 8A:
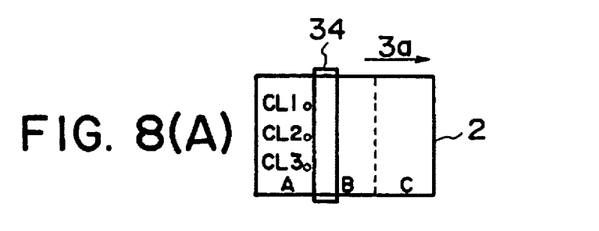
FIGS. 8(A) through 8(C) are schematic views for explaining the exposure operation in the embodiment of FIG. 7.
Figure 8B:
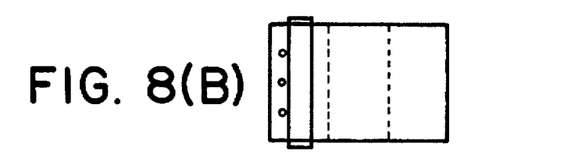
Figure 8C:
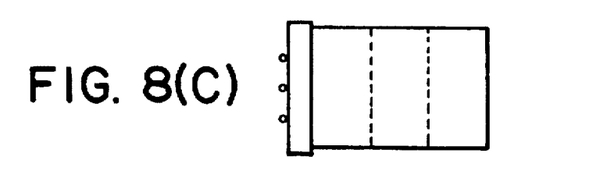

FIG. 7 illustrates the exposure sequence, and FIG. 8 illustrates the relationship between the reticle 2 and the opening 34 of the masking blade 33. Since the wafer moves relative to the masking blade in a similar manner as the reticle, it is not illustrated in FIGS. 8(A) through 8(C).

The example of FIGS. 8(A) through 8(C) is a case wherein one shot comprises three chips and, of these chips A, B and C, a description will be made of the exposure of the chip A only.

First, as illustrated in FIG. 8(A), the edge of the exposure region 34 is placed upon the edge of the chip A (step 71). Since, in this case, the scan direction is from the outside of the wafer toward the inside thereof, the edge of the chip A is the one which is at the boundary with the chip B. Also, it is assumed that the required precision for setting the edges of them can well be satisfied by the driving precision of them. If sufficient setting precision is not attainable by the mechanical precision because of the relation of the reticle pattern layout, for example, a separate mechanism for aligning them may be provided.

After the edges are aligned with each other, the exposure light shutter is opened, and the exposure process starts (step 72). Simultaneously with the shutter start, the scan of the reticle 2 starts. At that time, on the wafer 4 side, the focus measurement is performed with respect to the focus measurement points CL1, CL2 and CL3 which are on the side of the exposure region 34 that is going to be exposed. Then, as the points on the wafer 4, whose Z-axis positions have been measured in relation to the measurement points CL1, CL and CL, enter the exposure region 34, a correction is made in accordance with the results of the measurement, so as to bring the wafer surface into coincidence with the best focus plane of the projection lens 1.

Additionally, the scan operation is performed while correcting tilt of the image plane or relative positional deviation between the reticle and the wafer, for example, through an alignment mechanism (not shown) (step 73). FIG. 8(B) illustrates the state during the scan operation. In this manner, the scan operation is continued at a constant speed until all the regions of the chip A passes throughout the exposure regions 34. As all region of the chip A passes the exposure region 34, as shown in FIG. 8(C), the exposure light shutter is closed and the exposure process is discontinued (step 74). Then, the stage is moved to a position for a start of exposure of the subsequent shot (step 75).

As described above, in peripheral shots, a scanning exposure operation for unnecessary regions can be omitted. Thus, the throughput can be increased and the lifetime of the exposure light source can be prolonged.

A third embodiment of the present invention will be described. This embodiment corresponds to an example wherein, for exposure of wafer peripheral shots, the first and second embodiments described hereinbefore are used in combination. This enables efficient scanning exposure with enhanced throughput even for the wafer peripheral shots, in accordance with the scan direction for exposure of an adjacent shot thereto.

Figure 4:
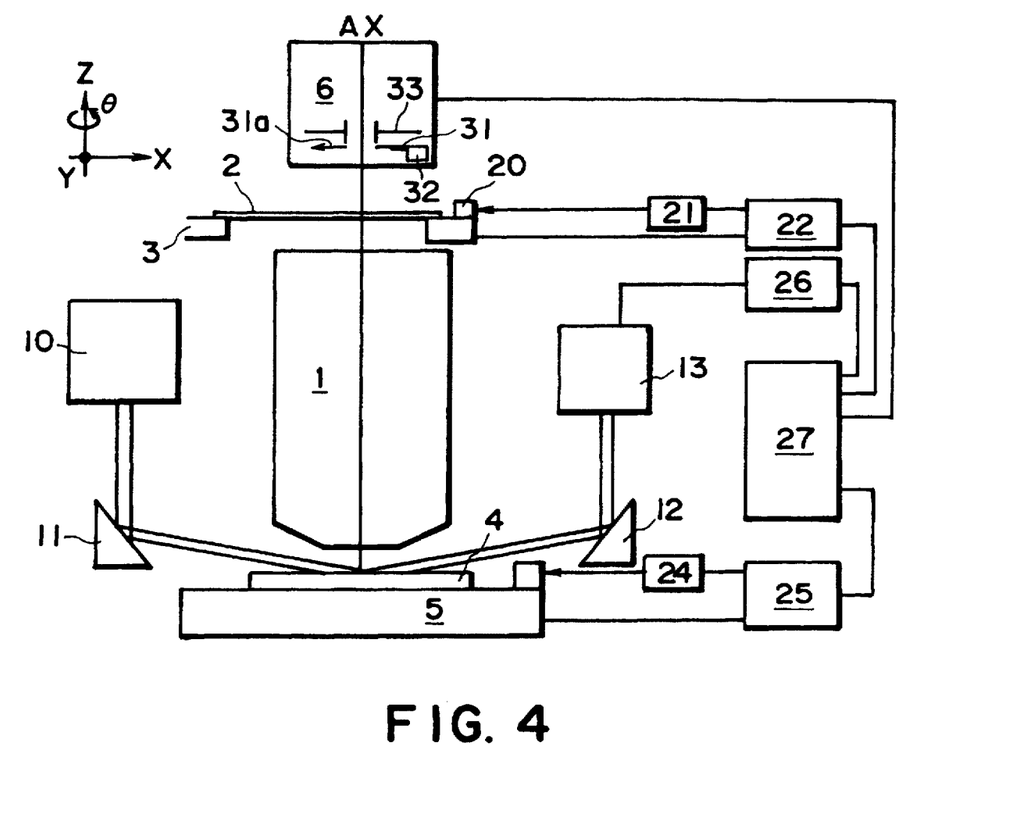
FIG. 4 is a schematic and diagrammatic view of a scanning exposure apparatus according to another embodiment of the present invention.

A fourth embodiment of the present invention will be described with reference to FIG. 4. In this embodiment, a light blocking plate 31 which is reciprocally movable in the same direction as the scan direction of the reticle 2, is provided within the exposure illumination system 6, at a position adjacent to the masking blade or a position which is optically conjugate with the masking blade. For exposure of only a portion of one shot, it is moved, under the control of the control device 32, with the exposure region boundary at a scan speed that reflects the magnification in relation to the reticle 2. This is effective to remove the limitation to the exposure scan direction, for wafer peripheral shots. Except for the procedure of exposure of wafer peripheral shots, the operation is essentially the same as that of the first embodiment.

The procedure of an exposure operation to a wafer peripheral portion in accordance with this embodiment, will be explained. The scan for exposure may be performed only to the chip or chips to be exposed. In this case, however, it is necessary to scanningly move the light blocking plate 31 of the exposure illumination optical system 6 in the direction of an arrow 31a in FIG. 4 (under an assumption that the reticle 2 and the masking blade 33 are inverted by a single imaging action), with the exposure region boundary and at a speed corrected in accordance with the magnification of an imaging lens (not shown) provided between the reticle 2 and the light blocking plate 33. This is because, if the above is not taken, an unnecessary portion is exposed due to the opening of the masking blade 31. Thus, for a shot which is not going to be exposed totally, the light blocking plate 31 is moved together with the reticle 2 and the wafer 4 to perform the scanning exposure.

The provision of such a movable light blocking plate such as at 31 removes the limitation to the exposure scan direction in relation to the wafer peripheral shots. Thus, it enables selection of operation with reduced loss, and it assures enhancement of throughput.

A fifth embodiment of the present invention will be described. This embodiment is adapted for what can be called a "mix-and-match" procedure wherein a wafer having been exposed by a stepper is going to be processed by a scanning exposure apparatus. Also, in this embodiment, an example wherein one shot comprises three chips will be explained.

Figure 9:
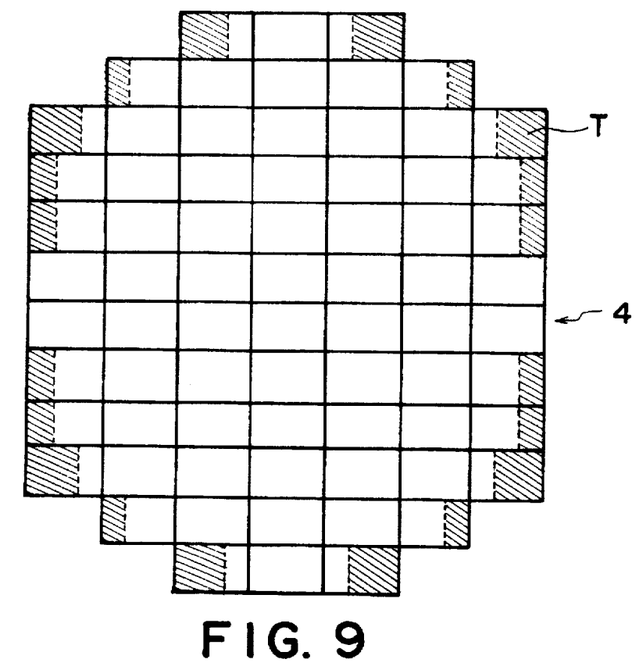
FIG. 9 is a schematic view for explaining an example of a shot layout to be processed in a stepper.
Figure 10:
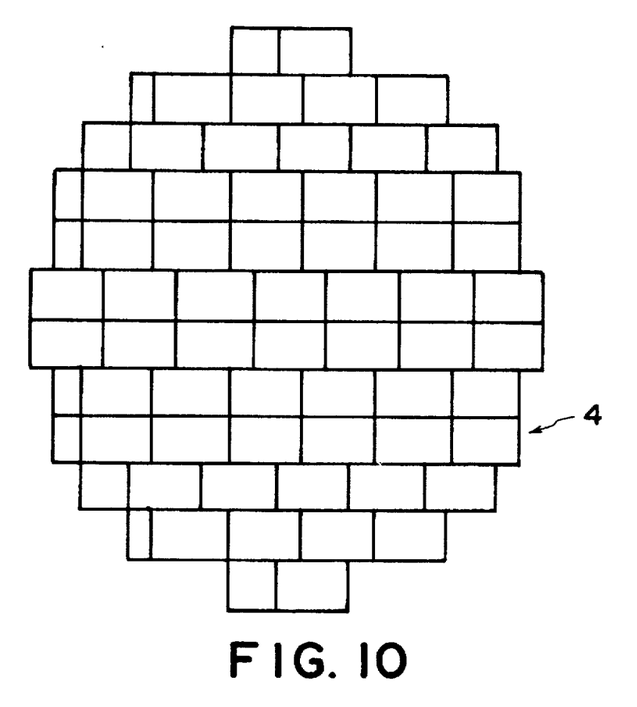
FIG. 10 is a schematic view for explaining a shot layout corresponding to that of FIG. 9 but to be processed in accordance with an embodiment of the present invention.

FIG. 9 illustrates a shot layout of seventy-two (72) chips having been printed by means of a stepper. Hatched regions T depict those regions in which a chip or chips partially overlie on the edge of the wafer 4 so that no semiconductor product is obtainable therefrom. If the layout is remade per chip, for exposure of the wafer 4 by a scanning exposure apparatus, a layout such as shown in FIG. 10 enables a smallest number of shots (sixty-eight shots). If the exposure process is performed in accordance with the layout the same as that of the stepper such as shown in FIG. 9, the scanning exposure has to be done to seventy-two shots. As compared therewith, the shot layout modified as shown in FIG. 10 enables sixty-eight shots, and it removes the necessity of scan exposure for four shots. Thus, the throughput increases accordingly.

In accordance with the present invention as has been described hereinbefore, in the layout preparation, the layout is determined per chip. This enables omitting scanning exposure for unnecessary regions, and it assures enhanced throughput. Also, it makes it possible to prolong the lifetime of the exposure light source.

While the invention has been described with reference to the structures disclosed herein, it is not confined to the details set forth and this application is intended to cover such modifications or changes as may come within the purposes of the improvements or the scope of the following claims.

What is claimed is:

1. An exposure apparatus, comprising:

a mask stage for holding a mask having an original pattern and being reciprocally movable along a scan direction;

a projection optical system for projecting at least a portion of the original pattern at a predetermined magnification;

a substrate stage for holding a photosensitive substrate on an imaging plane of said projection optical system and being reciprocally movable along the scan direction;

wherein said mask stage and said substrate stage are movable in a timed relation and at a speed ratio corresponding to the magnification of said projection optical system by which a projected image of the original pattern is scanningly printed on shots of the photosensitive substrate; and control means for controlling the scanning exposure on the basis of a shot layout of the photosensitive substrate which is determined per chip from information related to a chip structure and a chip size of the original pattern, wherein the original pattern comprises a plurality of original chip patterns, each shot area of the photosensitive substrate has a plurality of printed chip patterns having been formed thereon through an exposure process with a different exposure apparatus, separate from said exposure apparatus, and the shot layout is determined so that the number of shots with said exposure apparatus is fewer.

2. An apparatus according to claim 1, wherein the shot layout is recorded prior to the scanning exposure and said control means controls the scanning exposure in accordance with the record.

3. An apparatus according to claim 1, further comprising a light blocking plate disposed at one of a position adjacent to the mask and a position optically conjugate with the mask and being reciprocally movable along the scan direction, wherein, when the original pattern is scanningly printed on the photosensitive substrate, said light blocking plate is moved in a timed relation with a boundary of an exposure region of the mask and at a speed ratio relative to the mask corresponding to the magnification.

4. A scanning exposure method usable with a mask stage for holding a mask having an original pattern and being reciprocally movable along a scan direction, a projection optical system for projecting at least a portion of the original pattern at a predetermined magnification, and a substrate stage for holding a photosensitive substrate on an imaging plane of the projection optical system and being reciprocally movable along the scan direction, said method comprising the steps of:

moving the mask stage and the substrate stage in a timed relation and at a speed ratio corresponding to the magnification of the projection optical system by which a projected image of the original pattern can be scanningly printed on shots of the photosensitive substrate;

determining a shot layout of the photosensitive substrate per chip from information related to a chip structure and a chip size of the original pattern, wherein the original pattern comprises a plurality of original chip patterns, each shot area of the photosensitive substrate has a plurality of printed chip patterns having been formed thereon through an exposure process with a different exposure method, separate from said scanning exposure method, and the shot layout is determined so that the number of shots with said scanning exposure method is fewer; and controlling the scanning exposure in accordance with the shot layout.

5. A method according to claim 4, wherein the shot layout is recorded prior to the scanning exposure and the scanning exposure is controlled in accordance with the record.

6. A device manufacturing method usable with a mask stage for holding a mask having an original pattern and being reciprocally movable along a scan direction, a projection optical system for projecting at least a portion of the original pattern at a predetermined magnification, and a substrate stage for holding a photosensitive substrate on an imaging plane of the projection optical system and being reciprocally movable along the scan direction, said method comprising the steps of:

moving the mask stage and the substrate stage in a timed relation and at a speed ratio corresponding to the magnification of the projection optical system by which a projected image of the original pattern can be scanningly printed on shots of the photosensitive substrate, for manufacture of devices;

determining a shot layout of the photosensitive substrate per chip from information related to a chip structure and a chip size of the original pattern, wherein the original pattern comprises a plurality of original chip patterns, each shot area of the photosensitive substrate has a plurality of printed chip patterns having been formed thereon through an exposure process with a different exposure method, separate from said device manufacturing method, and the shot layout is determined so that the number of shots with said device manufacturing method is fewer; and controlling the scanning exposure in accordance with the shot layout.

7. A method according to claim 6, wherein the shot layout is recorded prior to the scanning exposure and the scanning exposure is controlled in accordance with the record.

* * * * *

UNITED STATES PATENT AND TRADEMARK OFFICE
CERTIFICATE OF CORRECTION

PATENT NO. : 5,793,471

DATED : August 11, 1998

INVENTORS : TSUNEO KANDA, ET AL.

It is certified that error appears in the above-identified patent and that said Letters Patent is hereby corrected as shown below:

COLUMN 1:

Line 23, " "reticle)" should read --"reticle")--;
    Line 27, "device" should read --devices--; and
    Line 29, "devices" (second occurrence) should read --device--.

COLUMN 3:

Line 53, "a peculiar procedure to" should read --a special procedure for--.

COLUMN 7:

Line 12, "descrip-" should read --a descrip- --;
    Line 13, "on" should read --of-- and "of" should read --of an--;
    Line 22, "FIG." should read --FIGS.--;
    Line 23, "illustrate;" should read --illustrate--;
    Line 26, "FIG." should read --FIGS.--; and
    Line 60, "passes" should read --pass--.

UNITED STATES PATENT AND TRADEMARK OFFICE
CERTIFICATE OF CORRECTION

PATENT NO. : 5,793,471

DATED : August 11, 1998

INVENTORS : TSUNEO KANDA, ET AL.

Page 2 of 2

It is certified that error appears in the above-identified patent and that said Letters Patent is hereby corrected as shown below:

COLUMN 8:

Line 16, "FIG. 8" should read --FIGS. 8(A) through 8(C)--;
    Line 17, "illustrates" should read --illustrate--;
    Line 44, "CL" should read --CL2--;
    Line 45, "CL," should read --CL3,--;
    Line 55, "passes" should read --pass--; and
    Line 56, "regions 34" should read --region 34--, "all region" should read --all regions-- and "passes" should read --pass--.

Signed and Sealed this

Twenty-ninth Day of June, 1999

Attest:

Attesting Officer

Q. TODD DICKINSON

Acting Commissioner of Patents and Trademarks